United States Patent [19]

Hamada

[11] Patent Number: 4,780,603
[45] Date of Patent: Oct. 25, 1988

[54] INTEGRATED CIRCUIT CARD AND CONNECTOR ARRANGEMENT USING SAME

[75] Inventor: Yoshitaka Hamada, Kawasaki, Japan
[73] Assignee: Mips Co., Ltd., Tokyo, Japan
[21] Appl. No.: 804,477
[22] Filed: Dec. 4, 1985

[30] Foreign Application Priority Data

Mar. 25, 1985 [JP] Japan .............................. 60-42966[U]

[51] Int. Cl.⁴ ........................................... G06K 19/06
[52] U.S. Cl. .................................... 235/492; 235/441; 361/399; 361/413
[58] Field of Search ....................... 339/75 M, 75 MP; 235/441, 485, 492, 495, 487; 361/399, 413

[56] References Cited

U.S. PATENT DOCUMENTS

| | | | |
|---|---|---|---|
| 2,928,063 | 3/1960 | Gammel | 339/75 MP |
| 3,702,464 | 11/1972 | Castrucci | 235/492 |
| 3,973,817 | 8/1976 | Stalley et al. | 361/413 X |
| 4,131,851 | 12/1978 | Martiny et al. | 361/399 X |

Primary Examiner—David L. Trafton
Attorney, Agent, or Firm—Birch, Stewart, Kolasch & Birch

[57] ABSTRACT

In an IC card and electronic equipment using an IC card inserted in its connector slot, a specially-shaped member is provided relatively at both the IC card and the card insertion connector on the electronic equipment. The member allows the IC card to be inserted into the insertion end on the insertion connector only when the IC card is inserted into the card slot in the correct direction with the correct face orientation with respect to the card insertion connector. The member stops the card from being inserted into the connector slot so that the card edge does not reach the terminals on the connector if the card is inserted in the opposite direction or with the card face oriented incorrectly.

8 Claims, 4 Drawing Sheets

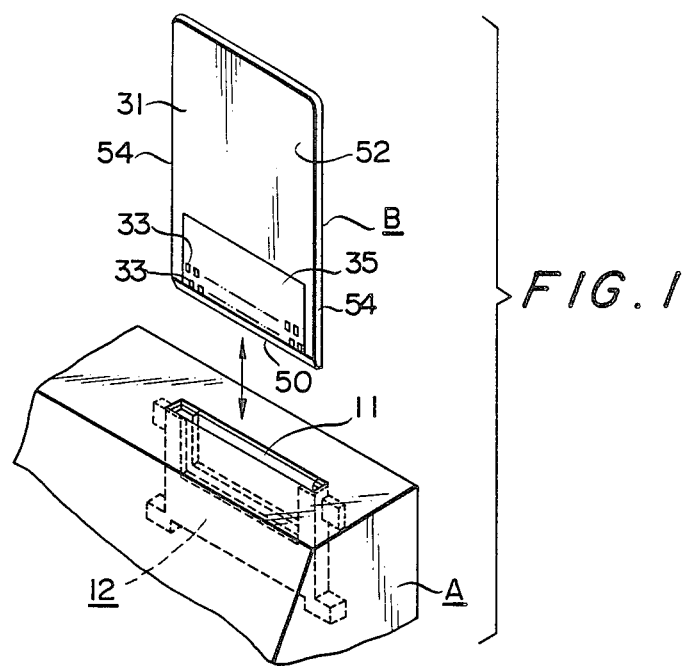
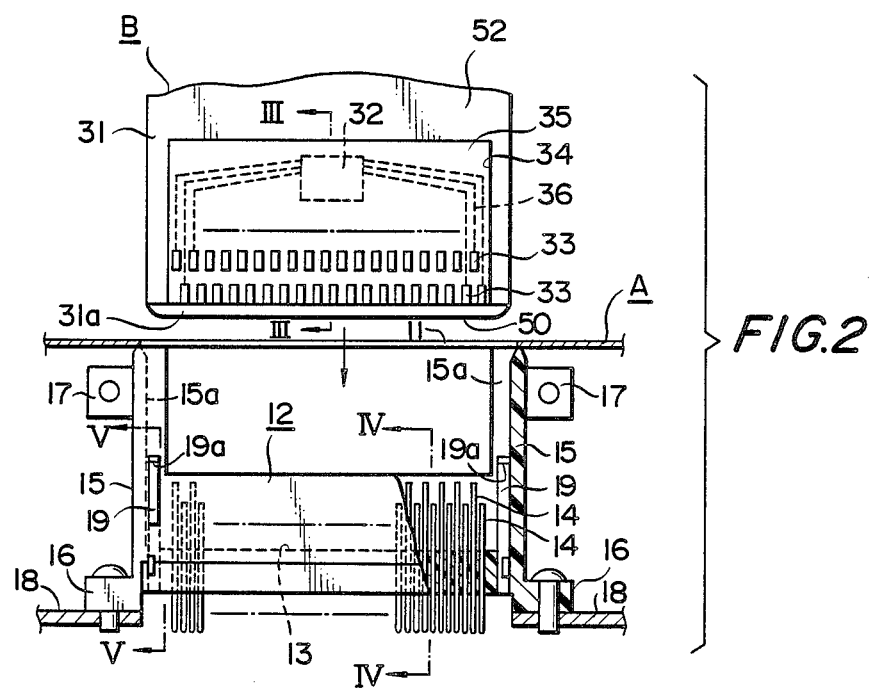

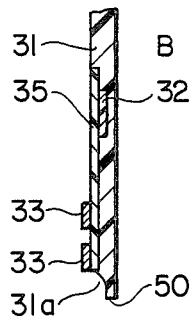
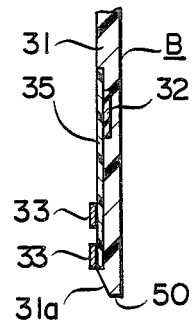
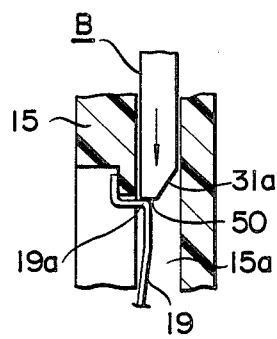
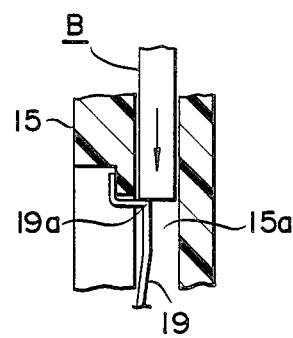
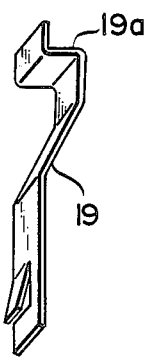
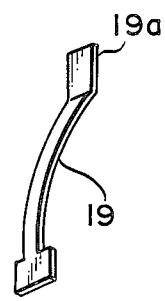
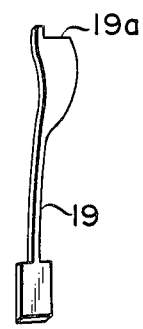

INTEGRATED CIRCUIT CARD AND CONNECTOR ARRANGEMENT USING SAME

BACKGROUND OF THE INVENTION

1. Field of the Invention

The present invention relates to an integrated circuit card and connector arrangement using an integrated circuit card, such as a personal computer, a hand-held computer, and a TV game machine.

2. Description of the Prior Art

An integrated circuit (IC) card electronic apparatus is a kind of equipment in which information is electrically transferred between circuitry on the electronic apparatus and IC circuit in a card with desired functions or programs, which card is inserted into a card receptacle slot of the apparatus. The apparatus is common in personal computers, hand-held computers, TV game machines and other electronic equipment.

An IC card consists of a compact, thin inflexible card body typically measuring about 85.6 mm long, 54 mm wide, and 0.8-2.0 mm thick. An IC chip (integrated circuit device) having desired functions is built into such a rigid or semi-rigid card body made of plastic or reinforced cardboard, and numerous connecting terminals are arranged along an edge on the surface of the card.

On the IC card of this type, an IC chip is built into the card by inserting a printed circuit board with the IC chip mounted into a rectangular hollow positioned near the card edge on the surface of the body, with the chip mounting surface opposing the hollow, and by fixing the board with adhesive. On the board, are printed wire connections for connecting the circuitry in the chip with connector terminals. The terminals are printed metal terminals which are arranged along the board edge corresponding to the card edge on the board surface opposite to the IC chip mounting surface, and are connected to the corresponding printed wires via throughholes.

An IC card may be inserted into the card receiving slot on the electronic equipment A, with the card edge having the terminals oriented toward the card receiving slot and with the card face, on which the terminals are arranged, oriented toward the operator, until the card edge abuts upon the bottom of the connector slot. Thus, the terminals come into full contact with the corresponding springy terminals of the slot, so that the IC circuit on the card is electrically interconnected to the control circuit on the electronic equipment to allow information to be transferred between them.

The connector is molded by plastic injection by which the springy terminals are molded at predetermined positions and intervals corresponding to the terminals on the card. Guide rails having a U-shape cross section are arranged in parallel and in opposition to each other at the left and right sides of the connector. The left and right edges of the card are inserted to the grooves on the left and right guide rails so that the card may be smoothly moved.

When an IC card is inserted into the card receiving slot on the electronic equipment, the specified card edge must be oriented toward the slot and the specified card surface toward the operator. The card may often be inserted by mistake with the back surface oriented toward the operator with the opposite edge oriented toward the slot. In this case, of course, the IC circuit on the card cannot appropriately be connected to the circuit on the electronic equipment. In addition, the terminals on the connector and/or the edge and surfaces of the card may be damaged. With some types of connectors, the card which has been inserted incorrectly cannot be pulled out, or otherwise becomes hard to pull out. If it is forcefully pulled out, the connector terminals or the card may be damaged.

SUMMARY OF THE INVENTION

It is, therefore, an object of the present invention to provide an integrated circuit card which prevents incorrect insertion of the IC card which may cause problems such as damage to the connector terminals.

It is another object of the present invention to provide a connector arrangement using an IC card which prevents the IC card from being inserted incorrectly into a receiving slot of the apparatus.

The foregoing objects are accomplished by providing a specially-shaped member or part on both an IC card and a card insertion connector on electronic equipment, which member or part allows the IC card to be inserted down to the bottom of the end of the receiving slot of the equipment only when the IC card is inserted into the slot in the correct direction with the correct face orientation with respect to the slot, and which stops the card from advancing farther than a position where the card edge does not reach the terminals on the connector when the card is inserted in the opposite direction or with the card face oriented incorrectly.

BRIEF DESCRIPTION OF THE DRAWINGS

The objects and features of the present invention will become more apparent from the consideration of the following detailed description taken in conjunction with the accompanying drawings in which:

FIG. 1 illustrates in a perspective view a card slot on electronic equipment and an IC card which is inserted into the slot;

FIG. 2 is a partially cutaway front view of a connector and a front lower portion of the IC card which is to be inserted into the connector;

FIGS. 3 and 3a are longitudinal cross-sectional views of the card taken along the line III—III of FIG. 2;

FIGS. 6A and 6B are partial cross-sectional plan views of the card inserted with the card face oriented incorrectly and the card inserted in the opposite direction, respectively;

FIGS. 7A, 7B and 7C illustrate the examples of the spring members which may be used in the embodiment shown in FIG. 2.

DESCRIPTION OF THE PREFERRED EMBODIMENTS

Figure 4:
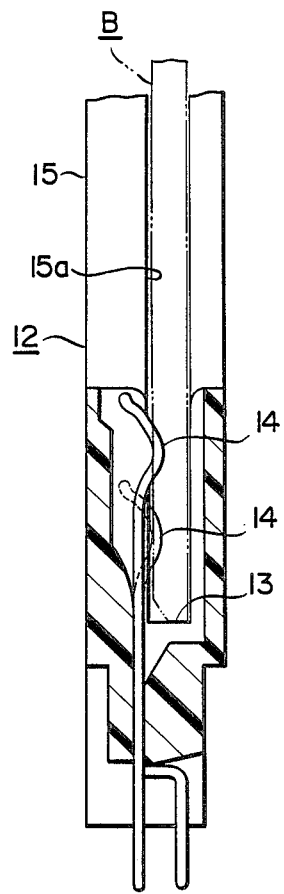
FIG. 4 is an enlarged, longitudinal cross-sectional view of the card receiving slot taken along the line IV—IV of FIG. 2.

Referring to FIG. 1, an integrated circuit (IC) card electronic device A is a kind of equipment in which information is electrically transferred between circuitry on the electronic equipment A and IC circuit in a card B with desired functions or programs, which card is inserted into a card receptacle slot 11. The equipment A may be common in personal computers, hand-held computers, TV game machines and other electronic equipment.

An IC card B consists of a compact, thin inflexible card body 31 specifically measuring about 85.6 mm long, 54 mm wide, and 0.8-2.0 mm thick. An IC chip 32 (integrated circuit device, FIGS. 2 and 3) having desired functions is built into a rigid or semi-rigid card body 1, which may preferably be made of plastic or reinforced cardboard. A plurality of rows of connecting terminals 33 are arranged along an edge 50 on the surface 52 of the card B.

On the IC card B of this embodiment, IC chip 32 is built into the card B, by inserting a printed circuit board 35 with the IC chip 32 mounted into a rectangular hollow 34 positioned near the card edge 50 on the surface 52 of the body 31, with the mounting surface of chip 2 facing the bottom of hollow 34, and by fixing in turn the board 35 with adhesive. On board 35, are printed wire connections 36 for connecting the circuitry included in chip 32 to connector terminals 33. Terminals 33 are printed metal terminals which are arranged along the board edge which is substantially parallel to the card edge 50 on the board surface opposite to the IC chip mounting surface, and are connected to the associated printed wires 36 via throughholes. Although a conventional card has the terminals 33 arranged in one transverse row, the card B for use in this embodiment has two rows of terminals 33 in a staggered form. The terminals 33 may be arranged on both surfaces of card B.

The IC card B may be inserted into the card receiving slot 11 on the electronic equipment A, with the card edge 50 having the terminals 33 oriented toward the card receiving slot 11 and with the card face 52 (in this example, the surface 52 on which the terminals 33 are arranged) oriented toward the operator, until the card edge 50 abuts upon the bottom 13 on connector 12. Thus, the terminals 33 come into full contact with the corresponding springy terminals 14, so that the IC circuit on the card B is electrically connected to the control circuit, not shown, on the electronic equipment A to allow information to be transferred between them.

The connector 12 is molded by plastic injection by which the springy terminals 14 are molded at predetermined positions and intervals corresponding to the terminals 33 on the card B. Guide rails 15—15 having a U-shape cross section are arranged in parallel and in opposition to each other at the left and right sides of the connector 12. The left and right edges of the card B are inserted to the grooves 15a—15a on the left and right guide rails 15—15 so that the card B may smoothly be moved. Attachment lugs 16 and 17 secures the connector 12 to the side plate 18 on the body of the electronic equipment A.

Referring to FIGS. 2, 3, 5, 6 and 7, in this illustrative embodiment, the fore edge 50 of the IC card B constitutes a cam face 31a of a slant or arc cross-sectional shape. The arc cross-sectional shape is shown, for example, in FIG. 3A. This arc shaped face may be used for all embodiments of the present invention, but is shown only in FIG. 3A for the sake of brevity. This cam or arc face 31a may be formed only at the left and right portions on the card edge 50.

On the card insertion connector 12 of electronic equipment A, springy members 19—19 are positioned, which are formed by bending spring plates. The projections 19a19a of the spring members 19—19 stand out in the grooves 15a—15a of the left and right guide rails 15—15 at a position between the card slot 11 and the terminal position.

Figure 5:
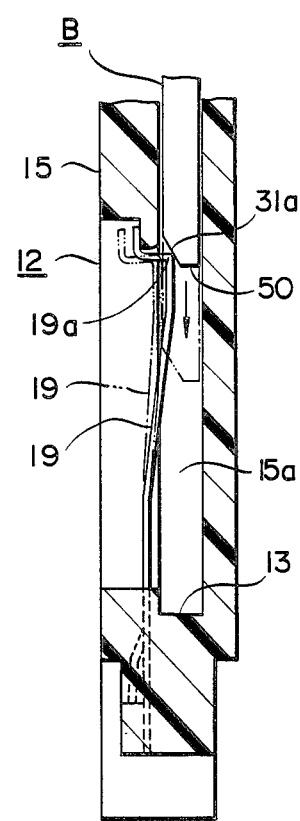
FIG. 5 is an enlarged, longitudinal cross-sectional view of the slot taken along the line V—V of FIG. 2.

When the IC card B is inserted to the card slot 11 on the connector 12 with the card edge 50 in the correct direction and with a primary surface 52 oriented correctly, as shown in FIG. 5, the cam face 31a on the card edge 50 comes in contact with the projections 19a—19a of the spring members 19—19 in the grooves 15a—15a on the connector 12. When the card B is pushed down farther, the cam face 31a moves the projections 19a—19a of the spring members 19—19 outward against the spring force produced by the spring member 19—19, FIG. 5, as shown by the two-dot chain line. This action allows the card B to bottom at the insertion end 13 on the connector 12.

If the card B is inserted with the card face 52 oriented incorrectly, as in FIG. 6A, or with the card edge 50 in the opposite direction, as in FIG. 6B, the cam face 31a does not come into contact with the projection 19a—19a of the spring members 19—19, so that the projections cannot be moved outward. Therefore, the edge 50 of the inserted card B is held by the projections 19a—19a of the spring members 19—19 to prevent the card edge 50 from reaching the terminals 14 on the connector 12.

The spring members 19—19 may be metal or plastic pieces of the shapes shown in FIGS. 7A, 7B and 7C, or may be molded integrally during injection molding of the connector 12.

Figure 8:
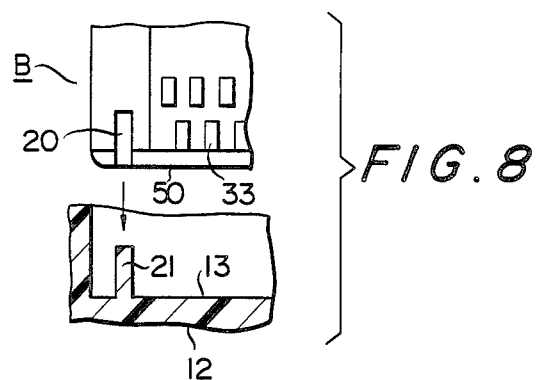
FIGS. 8, and 9A, 9B and 9C illustrate in top plan views the major portions of the card receiving slots of alternative embodiments of the invention.

In an alternative embodiment shown in FIG. 8, a projection 21 and a hollow 20 are provided on the connector 12 and the card B, respectively, to allow the card B to reach the insertion end 13 on the connector 12 only when the card B is correctly inserted. If the card B is inserted with the card face 52 oriented incorrectly or with the card edge 50 in the opposite direction, the projection 21 and the hollow 20 are not in alignment. Therefore, the edge 50 of the inserted card B is held to prevent the card edge 50 from reaching the terminals 14 on the connector 12.

Figure 9A:
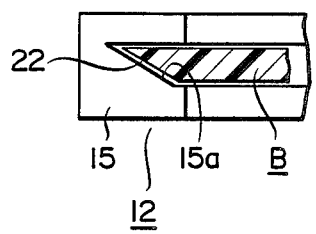
Figure 9B:
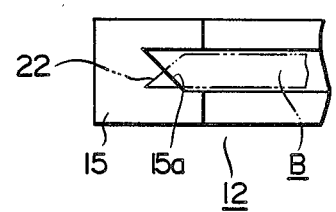
Figure 9C:
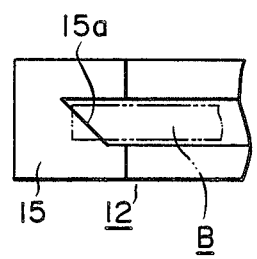

In a further alternative embodiment of the invention, as shown in FIG. 9A, either or both of the left and right side edges 54 of the card B are bevelled into a shape 22 over the length from the card fore edge 50 about to the midpoint on the card side 54. Accordingly, the cross section of the groove 15a of the guide rail 15 on the connector 12 is so shaped that the groove 15a accommodates the bevelled side edge 22 of the card B, shown by solid line, to allow the card fore edge 50 to reach the insertion end 13 on the connector 12 when the card B is inserted correctly, whereas the groove 15a does not accommodate the bevelled side edge 22 of the card B, shown by two-dot chain line in FIGS. 9A and 9B, when the card B is inserted incorrectly. Only the upper portion of guide rail 15a or the card slot 11 may be so shaped as to accommodate the bevelled side edge 22 of the card B only when the card B is inserted correctly.

With the embodiments discussed above, if the card B is inserted incorrectly by mistake, the card B is stopped from advancing farther than a position where the card edge 50 does not reach the terminals 14 on the connector 12. This warns the operator of incorrect card insertion, and prevents damage to the connector terminals because the edge 50 of the card B inserted incorrectly does not reach the connector terminals 14.

As can be seen from the above description, an advantage of this invention is that damage to connector terminals and/or an IC card or other problems due to incorrect insertion of the card can effectively be avoided.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An integrated circuit card for use in an electronic arrangement when inserted into a receiving slot of the arrangement, comprising:

a card body having a flat and rectangular shape; and an integrated circuit chip carried on a primary surface of said card body;

said card body having a plurality of connecting terminals which are arranged along an edge of the rectangular shape of said card body in two rows in a staggered form between the rows for establishing electrical connections of electronic circuitry of said integrated circuit chip with mating connecting terminals of a receiving slot of the electronic arrangement, into which slot said card body is inserted;

said card body having an unsymmetrical portion in a cross section which is perpendicular to the primary surface of said card body and parallel to a direction in which said card body is inserted into the receiving slot;

the unsymmetrical portion allowing said card body to be inserted into the receiving slot to the extent that the electrical connections are established between the plurality of connecting terminals only when said card body is inserted into the receiving slot in an appropriate direction with the primary surface of said card body in a predetermined orientation;

the unsymmetrical portion preventing insertion of said card body into the receiving slot when said card body is not inserted in the appropriate direction and predetermined orientation.

2. An integrated circuit card in accordance with claim 1, wherein said unsymmetrical portion comprises a cam face of slant cross-sectional shape which is formed on the edge of the rectangular shape so as to move a spring member projecting into the receiving slot to be pressed by said cam face only when said card body is inserted into the slot in the appropriate direction and predetermined surface orientation.

3. An integrated circuit card in accordance with claim 1, wherein said unsymmetrical portion comprises a cam face of arc cross-sectional shape which is formed on the edge of the rectangular shape so as to move a spring member projecting in the receiving slot to be pressed by said cam face only when said card body is inserted into the receiving slot in the appropriate direction and predetermined surface orientation.

4. An integrated circuit card in accordance with claim 1, wherein said card body comprises a bevelled face which is formed on one side edge of the rectangular face so as to mate with a groove formed in the receiving slot only when said card body is inserted into the receiving slot in the appropriate direction and predetermined surface orientation.

5. A connector arrangement for receiving an integrated circuit card which comprises a card body having a flat and rectangular shape, and an integrated circuit chip carried on a primary surface of the card body, the card body having a flat and rectangular shape, and an integrated circuit chip carried on a primary surface of the card body, the card body having a plurality of connecting terminals which are arranged along an edge of the rectangular shape of the card body in two rows in a staggered form between the rows to be interconnected to electronic circuitry of the integrated circuit chip, said card boy having an unsymmetrical portion in a cross section which is perpendicular to the primary surface of said card body and parallel to a direction in which said card body is inserted into a receiving slot, said connector arrangement comprising:

a connector having the receiving slot formed to receive the card body therein;

a plurality of connecting terminals provided on the inside of the receiving slot so as to establish electrical connections of said plurality of connecting terminals of said arrangement with the connecting terminals of the card when the card body is inserted into said receiving slot; and means, operative in response to the symmetrical portion of the card body, for allowing the card body to be inserted into the slot to the extent that the electrical connections are established between said plurality of connecting terminals of said arrangement and the connecting terminals of the card body only when the card body is inserted into the slot in an appropriate direction with the primary surface of the card body in a predetermined orientation;

said means being inoperative to portions of the card body other than the unsymmetrical portion to prevent the card body from being inserted into the receiving slot if the card body is not inserted in the appropriate direction and predetermined orientation.

6. A connector arrangement in accordance with claim 5, wherein the unsymmetrical portion comprises a cam face of a slant cross-sectional shape which is formed on the edge of the rectangular shape, said means comprising a spring member which is formed to project into the receiving slot so as to be pressed by the cam face only when the card body is inserted into the receiving slot in the appropriate direction and predetermined surface orientation.

7. A connector arrangement in accordance with claim 5, wherein the unsymmetrical portion comprises a cam face of arc cross-sectional shape which is formed on the edge of the rectangular shape, said means comprises a spring member which is formed to project into the receiving slot so as to be pressed by the cam face only when the card body is inserted into the receiving slot in the appropriate direction and predetermined surface orientation.

8. A connector arrangement in accordance with claim 5, wherein said card body comprises a bevelled face which is formed on one side edge of the rectangular shape, said means comprising a groove formed in the receiving slot so as to mate with the bevelled face only when the card body is inserted into the slot in the appropriate direction and predetermined surface orientation.

* * * * *